United States Patent [19]

Fukushima et al.

[11] Patent Number: 4,472,689
[45] Date of Patent: Sep. 18, 1984

[54] MULTI-PURPOSE FILTER

[75] Inventors: Noriyuki Fukushima, Tokyo; Masao Suzuki, Kanagawa, both of Japan

[73] Assignee: Sony Corporation, Tokyo, Japan

[21] Appl. No.: 476,854

[22] Filed: Mar. 18, 1983

[30] Foreign Application Priority Data

Mar. 18, 1982 [JP] Japan .................................. 57/43092

[51] Int. Cl.$^3$ ............................................. H03F 3/191
[52] U.S. Cl. .................................... 330/306; 330/310; 330/260
[58] Field of Search ............... 330/107, 109, 257, 260, 330/294, 302, 306, 310; 328/167; 307/520

[56] References Cited

U.S. PATENT DOCUMENTS 4,257,006 3/1981 Schaumann ...................... 328/167 X Primary Examiner—James B. Mullins
Assistant Examiner—Steven J. Mottola
Attorney, Agent, or Firm—Lewis H. Eslinger; Alvin Sinderbrand

[57] ABSTRACT

A multi-purpose filter includes a first integration circuit including a first differential amplifier having first input terminals and a first output, a first capacitor connected with the first output, and a first output circuit; a second integration circuit connected in series with the first integration circuit and including a second differential amplifier having second input terminals and a second output, a second capacitor connected with the second output, and a second output circuit; a feedback circuit connected between the first and second output circuits and the first input terminals; and a plurality of capacitor terminals connected with both ends of the first and second capacitors such that different filter characteristics are obtained by selecting different ones of the first input terminals, the second input terminals and the plurality of capacitor terminals as an input and an output of the filter.

9 Claims, 3 Drawing Figures

MULTI-PURPOSE FILTER

BACKGROUND OF THE INVENTION

1. Field of the Invention

This invention relates generally to filters and, more particularly, is directed to a multi-purpose filter.

2. Description of the Prior Art

It may be desirable for a filter to provide different filter characteristics at different times. For example, it may be desirable to provide a low pass filter characteristic at one time, a band pass filter characteristic at another time and a trap filter characteristic at still another time. In this regard, a prior art multi-purpose filter is known which is formed from a plurality of series-connected operational amplifier circuits which function as integration circuits. By selectively combining the input signal supplied to the multi-purpose filter and/or various output signals from the different operational amplifiers, different filter characteristics can be obtained.

However, such a prior art multi-purpose filter requires the use of four operational amplifiers which have discrete resistor and capacitor elements connected therewith and, as a result, is relatively complicated in construction. Further, the characteristics of such multi-purpose filter are determined, at least in part, by the characteristics of each integration circuit comprised of the operational amplifiers and the values of the resistors and capacitors connected therewith. If the temperature coefficients of these elements are large, that is, if these elements have a large temperature dependency, the multi-purpose filter has a temperature characteristic which is not negligible. Thus, the feedback resistors and capacitors must be carefully chosen to have a small temperature dependency which, in turn, results in an increased cost of the filter.

OBJECTS AND SUMMARY OF THE INVENTION

Accordingly, it is an object of this invention to provide a multi-purpose filter that avoids the above-described difficulties encountered with the prior art.

More particularly, it is an object of this invention to provide a multi-purpose filter having a relatively simple construction.

It is another object of this invention to provide a multi-purpose filter which can be constructed as an integrated circuit.

It is still another object of this invention to provide a multi-purpose filter having a frequency characteristic which does not vary greatly with temperature.

In accordance with an aspect of this invention, a filter includes first integration means including first differential amplifier means having first input terminal means and a first output, first capacitor means connected with the first output, and first output means; second integration means connected in series with the first integration means and including second differential amplifier means having second input terminal means and a second output, second capacitor means connected with the second output, and second output means; feedback means connected between the first and second output means and the first input terminal means; and at least one capacitor terminal means connected with the first and second capacitor means such that different filter characteristics are obtained by selecting different ones of the first input terminal means, the second input terminal means and the at least one capacitor terminal means as an input and an output of the filter.

The above, and other, objects, features and advantages of the present invention will become readily apparent from the following detailed description thereof which is to read in connection with the accompanying drawings.

DETAILED DESCRIPTION OF A PREFERRED EMBODIMENT

Figure 1:
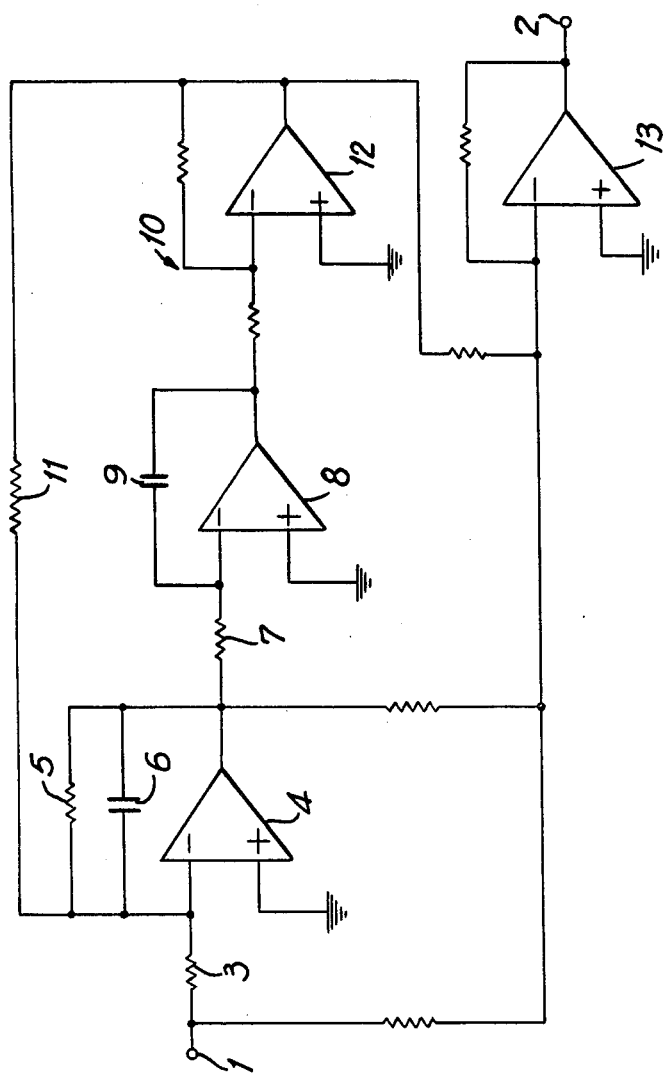
FIG. 1 is a circuit-wiring diagram of a multi-purpose filter according to the prior art.

Referring to the drawings in detail, and initially to FIG. 1 thereof, in a multi-purpose filter according to the prior art, an input signal is supplied from an input terminal 1 through a resistor 3 to the inverting input of an operational amplifier 4, the non-inverting input thereof being connected to ground. Operational amplifier 4 forms a first integration circuit, the characteristics of which are determined by the parallel combination of a feedback resistor 5 and a feedback capacitor 6 connected between the output of operational amplifier 4 and the inverting input thereof.

The output from operational amplifier 4 is connected through a resistor 7 to the inverting input of a second operational amplifier 8, the non-inverting input thereof being connected to ground. Operational amplifier 8 also forms an integration circuit with the characteristics thereof being determined by input resistor 7 and a feedback capacitor 9 connected between the output of operational amplifier 8 and the inverting input thereof. The output of operational amplifier 8 is connected through a resistor to the inverting input of a third operational amplifier 12 having its non-inverting input connected to ground and having a feedback resistor connected between the output and non-inverting input thereof. Operational amplifier 12 functions as an inverting amplifier 10. In this manner, the output of operational amplifier 12 corresponds to an inversion of the output of the second integration circuit formed by operational amplifier 8. The output from operational amplifier 12 is fed back through a resistor 11 to the inverting input of operational amplifier 4.

The output from the prior art filter of FIG. 1 is produced at an output terminal 2 at the output of a fourth operational amplifier 13. More particularly, the input signal from input terminal 1, the output from operational amplifier 4 which forms the first integration circuit and the output from operational amplifier 12 which corresponds to the output of the second integration circuit are each selectively supplied through a resistor to the inverting input of operational amplifier 13, the non-inverting input thereof being connected to ground. In addition, a feedback resistor is connected between the output and inverting input of operational amplifier 13. In this manner, operational amplifier 13 constitutes an adder which sums the signals supplied to its inverting input.

It is to be appreciated that, because of the integration characteristics of operational amplifiers 4 and 8, a band pass filter output is obtained from operational amplifier 4, while a low pass filter output is obtained from operational amplifier 12. By selectively supplying at least one or more of the input signal, output from operational amplifier 4 and output from operational amplifier 12, to the inverting input of operational amplifier 13, different frequency characteristics for the multi-purpose filter of FIG. 1 can be obtained at output terminal 2. For example, when only the output signal from operational amplifier 4, that is, the band pass filter output, is supplied to operational amplifier 13, a band pass filter output is obtained at output terminal 2. When only the output signal from operational amplifier 12, that is, the low pass filter output, is supplied to operational amplifier 13, a low pass filter output is obtained at output terminal 2. On the other hand, when the input signal from input terminal 1 and the band pass filter output from operational amplifier 4 are both supplied to operational amplifier 13, a trap filter output is produced at output terminal 2, and when both the input signal from input terminal 1 and the low pass filter output from operational amplifier 12 are supplied to operational amplifier 13, a high pass filter output is produced at output terminal 2.

It is to be appreciated, however, that the prior art multi-purpose filter of FIG. 1 requires the use of four operational amplifier 4, 8, 12 and 13 which are connected with discrete resistor and capacitor elements, thereby rendering the construction relatively complicated. Further, the characteristics of the filter are determined by the characteristics of each integration circuit comprised of operational amplifiers 4 and 8 and the values of the feedback resistors 5 and 11, resistor 7 and feedback capacitors 6 and 9. If the characteristics of operational amplifiers 4 and 8 and the values of resistors 5, 7 and 11 and capacitors 6 and 9 vary greatly with temperature, that is, such elements having a large temperature coefficient, the multi-purpose filter of FIG. 1 has a temperature characteristic which is not negligible. As a result, resistors 5, 7 and 11 and capacitors 6 and 9 must be chosen to have a small temperature coefficient, that is, such that the values thereof do not vary greatly with temperature. This, of course, results in an increased cost of the multi-purpose filter. The multi-purpose filter according to the present invention, as will be hereinafter described, has a relatively simple configuration, can be constructed as an integrated circuit (IC) and has a small temperature dependence.

Figure 2:
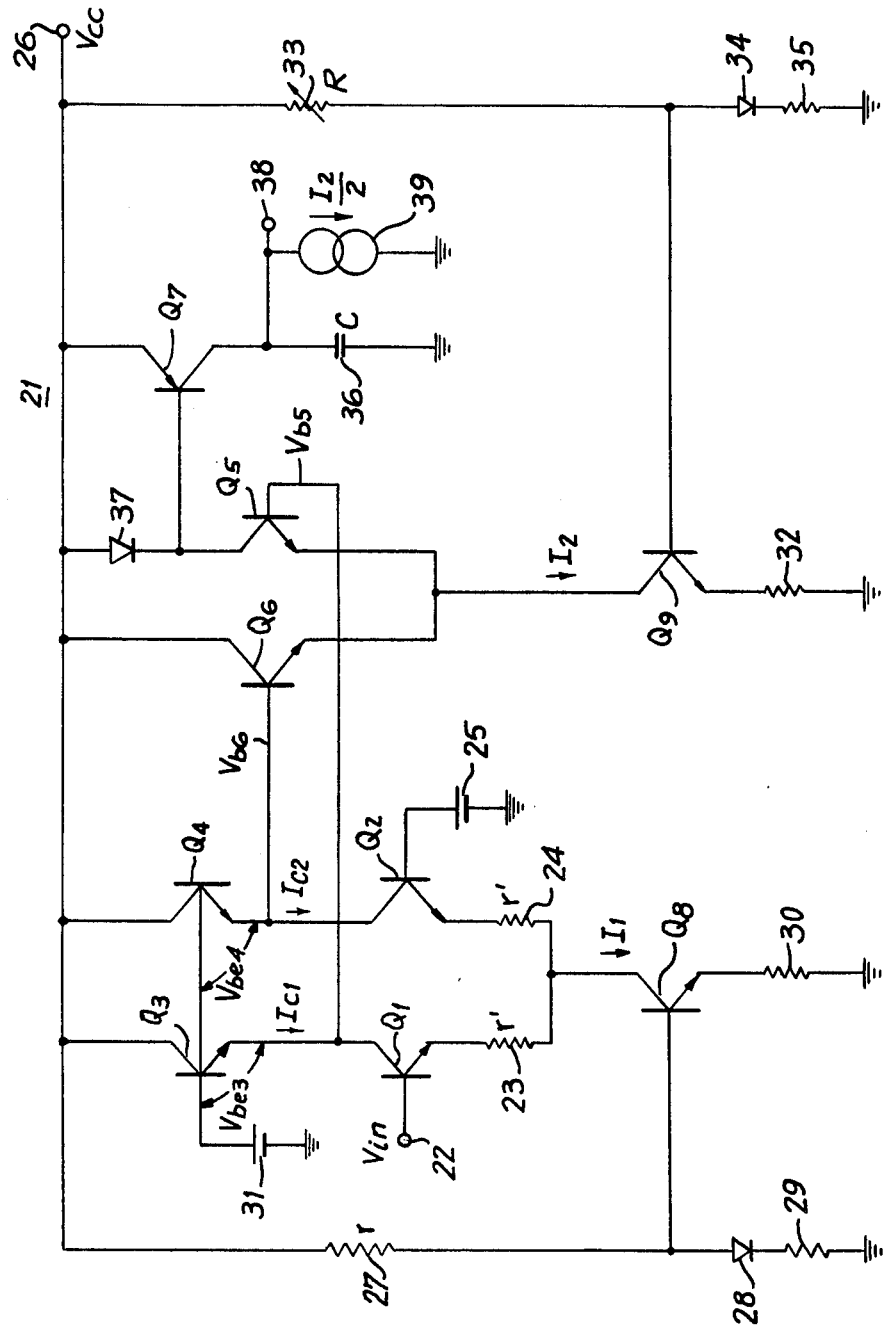
FIG. 2 is a circuit-wiring diagram of an integration circuit that can be used with a multi-purpose filter according to the present invention.

Referring now to FIG. 2, an integration circuit 21 that can be employed in a multi-purpose filter according to the present invention includes a differential amplifier formed from two NPN transistors $Q_1$ and $Q_2$. More particularly, the emitters of transistors $Q_1$ and $Q_2$ are connected together at a common connection point through resistors 23 and 24, respectively, each having a resistance r'. The base of transistor $Q_1$ is supplied with an input signal $V_{in}$ from an input terminal 22 of integration circuit 21 and the base of transistor $Q_2$ is supplied with a reference voltage from a reference voltage source 25. The common connection point between the emitters of transistors $Q_1$ and $Q_2$ is supplied with a constant current $I_1$ from a constant current source formed by an NPN transistor $Q_8$ and a bias circuit connected to the base thereof. As shown in FIG. 2, transistor $Q_8$ has its collector connected to the commonly-connected emitters of transistors $Q_1$ and $Q_2$ and its emitter connected to ground through a resistor 30. The bias circuit connected to the base of transistor $Q_8$ is formed by a series combination of a resistor 27 having a resistance r, a forwardly-biased diode 28 and a resistor 29 connected between a voltage source terminal 26, which supplies a source voltage $V_{CC}$, and ground. The connection between resistor 27 and diode 28 is connected to the base of transistor $Q_8$. As a result, transistor $Q_8$ supplies a constant current $I_1$ to the differential amplifier. In addition, the collectors of transistors $Q_1$ and $Q_2$ are connected to voltage source terminal 26 through the emitter-collector paths of two NPN transistors $Q_3$ and $Q_4$, respectively. The bases of transistors $Q_3$ and $Q_4$ are each supplied with a reference voltage from a reference voltage source 31.

The output voltages $V_{b5}$ and $V_{b6}$ at the collectors of transistors $Q_1$ and $Q_2$ correspond to the collector currents $I_{c1}$ and $I_{c2}$ at the collectors of transistors $Q_1$ and $Q_2$, respectively, since the base-emitter voltages $V_{be3}$ and $V_{be4}$ of the respective transistors $Q_3$ and $Q_4$ are functions of $I_{c1}$ and $I_{c2}$. The collectors of transistors $Q_1$ and $Q_2$, and therefore the emitters of transistors $Q_3$ and $Q_4$, respectively, are connected to the bases of two NPN transistors $Q_5$ and $Q_6$, respectively, which are connected together in a differential amplifier arrangement. More particularly, the emitters of transistors $Q_5$ and $Q_6$ are commonly connected to ground through the series connection of the collector-emitter path of an NPN transistor $Q_9$ and a resistor 32. A series circuit of a variable resistor 33 having a variable resistance R, a forwardly-biased diode 34 and a resistor 35 is connected between voltage source terminal 26 and ground and provides a bias voltage to the base of transistor $Q_9$, that is, the connection between variable resistor 33 and diode 34 is connected to the base of transistor $Q_9$. The biasing circuit of resistors 33 and 35 and diode 34, along with transistor $Q_9$, constitute a constant current source for supplying a constant current $I_2$ to the commonly-connected emitters of transistors $Q_5$ and $Q_6$.

In addition, the collector of transistor $Q_6$ is connected to voltage source terminal 26 and the collector of transistor $Q_5$ is connected through a current mirror circuit to an output circuit of integration circuit 21. More particularly, the current mirror circuit is comprised of a diode 37 arranged in the forward-biasing direction thereof between voltage source terminal 26 and the collector of transistor $Q_5$, and a PNP transistor $Q_7$ having its base connected to the connection point between diode 37 and the collector of transistor $Q_5$, its emitter connected with voltage source terminal 26 and its collector connected to the aforementioned output circuit of integration circuit 21. In this manner, the current flowing through the collector of transistor $Q_5$ also flows to the output circuit of integration circuit 21 without affecting the current through the collector of transistor $Q_5$.

The output circuit of integration circuit 21 includes a capacitor 36 having a capacitance C connected between the collector of transistor $Q_7$ and ground a constant current source 39 which produces a constant current $I_2/2$ connected in parallel with capacitor 36. The output of integration circuit 21 is obtained at an output terminal 38 connected to the end of capacitor 36 which is not grounded. It is to be appreciated that, since the current from constant current source 39 equal to $I_2/2$ is equal to the DC component of the collector current of transistor $Q_5$, only the signal component of the output current thereat flows to capacitor 36. Thus, a current corresponding to input signal $V_{in}$ supplied to input terminal 22 is supplied to capacitor 36, whereby an integrated output voltage is obtained across the terminals of capacitor 36.

In operation, it is to be appreciated that the collector currents $I_{c1}$ and $I_{c2}$ of transistors $Q_1$ and $Q_2$ which are connected in a differential amplifier arrangement can be expressed as follows:

$$I_{c1} = \frac{I_1}{2} + \frac{V_{in}}{2r'}, \quad (1)$$

$$I_{c2} = \frac{I_1}{2} + \frac{V_{in}}{2r'}. \quad (2)$$

The base-emitter voltages $V_{be3}$ and $V_{be4}$ of transistors $Q_3$ and $Q_4$ can be expressed as follows:

$$V_{be3} = \frac{kT}{q} \ln \frac{I_{c1}}{I_0} \quad (3)$$

$$= \frac{kT}{q} \ln \frac{I_1/2 + V_{in}/2r'}{I_0},$$

$$V_{be4} = \frac{kT}{q} \ln \frac{I_{c2}}{I_0} \quad (4)$$

$$= \frac{kT}{q} \ln \frac{I_1/2 - V_{in}/2r'}{I_0},$$

in which $I_0$ is the reverse saturation current, k is the Boltzmann constant, T is the absolute temperature and q is the electronic charge. Thus, if reference voltage source 31 supplies a reference voltage $E_1$ to the bases of transistors $Q_3$ and $Q_4$, the potentials $V_{b5}$ and $V_{b6}$ at the bases of transistors $Q_5$ and $Q_6$, respectively, can be expressed as follows:

$$V_{b5} = E_1 - V_{be3} \quad (5)$$

$$= E_1 - \frac{kT}{q} \ln \frac{I_1/2 + V_{in}/2r'}{I_0},$$

$$V_{b6} = E_1 - V_{be4} \quad (6)$$

$$= E_1 - \frac{kT}{q} \ln \frac{I_1/2 + V_{in}/2r'}{I_0}.$$

It is to be appreciated that, by combining equations (5) and (6), the output differential voltage $V_{bb}$ between the bases of transistors $Q_5$ and $Q_6$ therefore can be represented as follows:

$$V_{bb} = V_{b5} - V_{b6} = \frac{kT}{q} \ln \frac{I_1/2 + V_{in}/2r'}{I_1/2 - V_{in}/2r'}. \quad (7)$$

Assuming that the signal components of the collector currents of transistors $Q_5$ and $Q_6$ are $+i_{out}$ and $-i_{out}$, respectively, the base-emitter voltages $V_{be5}$ and $V_{be6}$ of transistors $Q_5$ and $Q_6$ can be expressed as follows:

$$V_{be5} = \frac{kT}{q} \ln \frac{I_2/2 + i_{out}}{I_0}, \quad (8)$$

$$V_{be6} = \frac{kT}{q} \ln \frac{I_2/2 - i_{out}}{I_0}. \quad (9)$$

By subtracting equation (9) from equation (8), the output differential voltage $V_{bb}$ between the bases of transistors $Q_5$ and $Q_6$ can again be obtained as follows:

$$V_{bb} = \frac{kT}{q} \ln \frac{I_2 + 2i_{out}}{I_2 - 2i_{out}}. \quad (10)$$

If equations (7) and (10) are equated, as follows:

$$V_{bb} = \frac{kT}{q} \ln \frac{I_1/2 + V_{in}/2r'}{I_1/2 - V_{in}/2r'} = \frac{kT}{q} \ln \frac{I_2 + 2i_{out}}{I_2 - 2i_{out}}, \quad (11)$$

and then solved for $i_{out}/V_{in}$, the following result is obtained:

$$\frac{i_{out}}{V_{in}} = \frac{1}{2r'} \cdot \frac{I_2}{I_1}. \quad (12)$$

It is to be appreciated, however, that:

$$I_1 \simeq \frac{V_{cc} - V_{be}}{r}, \quad (13)$$

$$I_2 \simeq \frac{V_{cc} - V_{be}}{R}, \quad (14)$$

which, in turn results in the following relation:

$$\frac{I_2}{I_1} = \frac{r}{R}. \quad (15)$$

In this manner, the gain of integration circuit 21 is defined by the ratio of constant current $I_2$ to constant current $I_1$, and is controlled by changing the resistance R of variable resistor 33 which, in turn, changes the value of constant current $I_2$. As a result, by substituting equation (15) into equation (12), the integrated output voltage of integration circuit 21 at output terminal 38 can be expressed as follows:

$$V_{out} = \frac{r}{r'} \cdot \frac{1}{2j\omega CR} \cdot V_{in}. \quad (16)$$

It is to be recognized from equation (16) that the temperature characteristics of resistors 23 and 24 each having a resistance r' and resistor 27 having a resistance r cancel out by fabricating these resistors on the tip of an integrated circuit (IC). As a result, the temperature dependency of integration circuit 21 can be greatly reduced by providing a capacitor 36 having a capacitance C and a variable resistor 33 having a resistance R which does not vary greatly with changes in environmental temperature.

Figure 3:
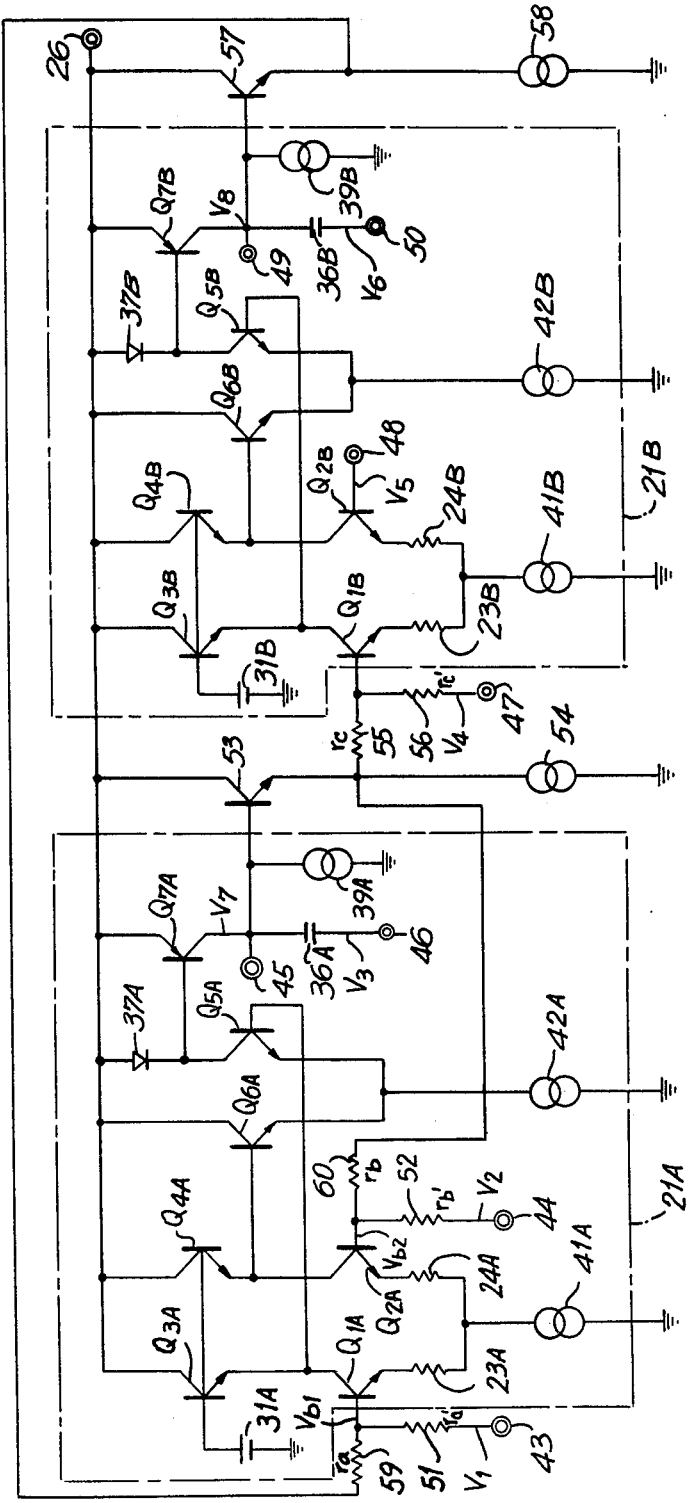
FIG. 3 is a circuit-wiring diagram of a multi-purpose filter according to one embodiment of the present invention.

Referring now to FIG. 3, a multi-purpose filter according to one embodiment of the present invention and which employs integration circuit 21 of FIG. 2 will now be described, in which elements corresponding to those of integration circuit 21 are identified by the same reference numerals and a detailed description thereof will be omitted herein for the sake of brevity. More particularly, the multi-purpose filter of FIG. 3 utilizes two integration circuits 21A and 21B connected in series and which are shown enclosed in respective dot-dash lines. As a result, elements of integration circuits 21A and 21B which correspond to those in integration circuit 21 of FIG. 2 have the letters A and B, respectively, added to the respective reference numerals. Further, for the sake of brevity in the drawings, the constant current sources of FIG. 2 which produce constant currents $I_1$ and $I_2$ are identified by constant current sources 41 and 42, respectively, in the multi-purpose filter of FIG. 3.

In addition, in the multi-purpose filter of FIG. 3, various terminals are provided, one of which is selected as an input and one of which is selected as an output of the multi-purpose filter. By selecting different ones of the terminals as an input and an output of the multi-purpose filter of FIG. 3, different filter characteristics, such as a low pass filter characteristic, high pass filter characteristic, band pass filter characteristic and trap filter characteristic, can be obtained, as will now be described. The differential amplifier formed by transistors $Q_{1A}$ and $Q_{2A}$ includes first input terminal means connected to the bases of the respective transistors. As shown in FIG. 3, the base of transistor $Q_{1A}$ is connected through a resistor 51 having a resistance $r_a'$ with a first terminal 43 of the first input terminal means which is at a potential $V_1$, and the base of transistor $Q_{2A}$ is connected through a resistor 52 having a resistance $r_b'$ with a second terminal of the first input terminal means which is at a potential $V_2$. In addition, the output from integration circuit 21A is supplied to the base of an NPN transistor 53 having its collector connected to voltage source terminal 26 and its emitter connected to ground through a current source 54, that is, transistor 53 is connected in an emitter-follower configuration. The signal at the emitter of transistor 53 is supplied as a feedback signal through a resistor 60 having a resistance $r_b'$ to the base of transistor $Q_{2A}$, along with the signal from terminal 44. In like manner, the output of second integration circuit 21B is supplied to the base of an NPN transistor 57 having its collector connected to voltage source terminal 26 and its emitter connected to ground through another constant current source 58. The signal at the emitter of transistor 57 is fed back through a resistor 59 having a resistance $r_a'$ to the base of transistor $Q_{1A}$, along with the signal from terminal 43.

In like manner, the differential amplifier comprised of transistors $Q_{1B}$ and $Q_{2B}$ of integration circuit 21B includes second input terminal means. In particular, the base of transistor $Q_{1B}$ is connected to a first terminal 47 of the second input terminal means which is at a potential $V_4$ through a resistor 56 having a resistance $r_c'$, and the base of transistor $Q_{2B}$ is supplied with a potential $V_5$ from a second terminal 48 of the second input terminal means. In addition, the output signal from first integration circuit 21A at the emitter of transistor 53 is supplied to the base of transistor $Q_{1B}$ through a resistor 55 having a resistance $r_c$.

Further, capacitor terminals 45 and 46 are connected to both ends of capacitor 36A such that capacitor terminal 45 is also connected with the collector of transistor $Q_{7A}$ and is at a potential $V_7$, and capacitor terminal 46 is connected to the opposite end of capacitor 36A and is at a potential $V_3$. In like manner, capacitor terminals are also provided with respect to capacitor 36B. In particular, a capacitor terminal 49 is connected to the connection point between the collector of transistor $Q_{7B}$ and capacitor 36B and is at a potential $V_8$, and a capacitor terminal 50 is connected to the opposite end of capacitor 36B and is at a potential $V_6$.

As previously discussed, the input and output of the multi-purpose filter of FIG. 3 are selected from terminals 43–50 to provide different filter characteristics, as will now be discussed in greater detail. In the first place, the input voltage $V_{b1}$ at the base of transistor $Q_{1A}$ can be expressed as follows:

$$V_{b1} = \frac{r_a}{r_a + r_a'} V_1 + \frac{r_a'}{r_a + r_a'} V_8, \quad (17)$$

and, in like manner, the input voltage $V_{b2}$ at the base of transistor $Q_{2A}$ can be expressed as follows:

$$V_{b2} = \frac{r_b}{r_b + r_b'} V_2 + \frac{r_b'}{r_b + r_b'} V_7. \quad (18)$$

By substituting equations (17) and (18) into equation (16), the output voltage $V_{O1}$ of first integration circuit 21A, that is, the voltage across the two terminals of capacitor 36A, can be expressed as follows:

$$V_{O1} = \frac{r}{r'} \cdot \frac{1}{2j\omega C_A R} V_{in} \quad (19)$$

$$= \frac{r}{r'} \cdot \frac{1}{2j\omega C_A R} (V_{b1} - V_{b2})$$

$$= \frac{1}{s_1} \cdot (aV_1 + a'V_8 - bV_2 - b'V_7),$$

where:

$$s_1 = 2j\omega C_A R \cdot \frac{r'}{r}, \quad (20)$$

$$a = \frac{r_a}{r_a + r_a'}, \quad (21)$$

$$a' = \frac{r_a'}{r_a + r_a'}, \quad (22)$$

$$b = \frac{r_b}{r_b + r_b'}, \quad (23)$$

$$b' = \frac{r_b'}{r_b + r_b'}. \quad (24)$$

It is to be appreciated that, in equation (19), the terms r and r' correspond to the equivalent terms used in integration circuit 21 of FIG. 2, that is, r represents the equivalent resistance of resistor 27 used in current source 41A and resistance r' represents the resistance of resistors 23A and 24A. It is further to be appreciated that the following relation also exists:

$$V_7 = V_{O1} + V_3 \quad (25).$$

In like manner, the voltage $V_{O2}$ across the terminals of capacitor 36B of second integration circuit 21B can be expressed as follows:

$$V_{O2} = \frac{1}{s_2} \cdot (V_5 - cV_4 - c'V_7). \quad (26)$$

where:

$$c = \frac{r_c}{r_c + r_c'}. \quad (27)$$

$$c' = \frac{r_c'}{r_c + r_c'}. \quad (28)$$

In the same manner as with integration circuit 21A, the following equation is established with respect to integration circuit 21B:

$$V_8 = V_{O2} + V_6 \quad (29).$$

A description of some of the different filter characteristics that can be obtained with the multi-purpose filter according to the present invention will now be described with respect to the following examples in which different terminals 43-50 are selected as the input and output of the multi-purpose filter of FIG. 3. More particularly, if terminal 50 is selected as the input to the filter and terminal 45 is selected as the output of the filter, $V_6 = V_{in}$ and $V_7 = V_{out}$. It is to be appreciated that the voltages $V_1$, $V_2$, $V_3$, $V_4$ and $V_5$ at terminals 43, 44, 46, 47 and 48, respectively, are all equal to 0. Substituting the voltages $V_1$-$V_7$ into equations (19) and (25), the following result is obtained:

$$V_{out} = V_{01} = \frac{1}{s_1}(a'V_8 - b'V_{out}). \quad (30)$$

In like manner, if the values for voltages $V_1$-$V_7$ are substituted into equations (26) and (29), the following result is obtained:

$$V_8 = \frac{-c'}{s_2} V_{out} + V_{in}. \quad (31)$$

By substituting equation (31) into equation (30), the transfer function of the multi-purpose filter of FIG. 3 is obtained as follows:

$$\frac{V_{out}}{V_{in}} = \frac{s_2 a'}{s_1 s_2 + b' s_2 + a' c'}. \quad (32)$$

It is to be appreciated from equation (32) that a band pass output is obtained at output terminal 45 of the multi-purpose filter of FIG. 3 when terminal 50 is selected as the input of the filter and terminal 45 is selected as the output of the filter.

In order to obtain a trap filter output from the multi-purpose filter of FIG. 3, terminals 46 and 48 are selected as inputs of the multi-purpose filter and terminal 45 is selected as the output thereof. Accordingly, $V_3 = V_5 = V_{in}$, $V_7 = V_{out}$, and $V_1 = V_2 = V_4 = V_6 = 0$. Substituting voltages $V_1$-$V_7$ into equations (19) and (25), the following equation is obtained:

$$V_{out} = \frac{1}{s_1}(a'V_8 - b'V_{out}) + V_{in}. \quad (33)$$

In like manner, by substituting voltages $V_1$-$V_7$ into equations (26) and (29), the following equation is obtained:

$$V_8 = \frac{1}{s_2}(V_{in} - c'V_{out}). \quad (34)$$

By substituting equation (34) into equation (33), the transfer characteristic of the multi-purpose filter of FIG. 3 has a trap filter characteristic as follows:

$$\frac{V_{out}}{V_{in}} = \frac{s_1 s_2 + a'}{s_1 s_2 + b' s_2 + a' c'}. \quad (35)$$

In order to obtain a low pass filter output from the multi-purpose filter of FIG. 3, terminal 48 is selected as the input of the filter and terminal 45 is selected as the output thereof. In this manner, $V_5 = V_{in}$, $V_7 = V_{out}$, and $V_1 = V_2 = V_3 = V_4 = V_6 = 0$. Substituting voltages $V_1$-$V_7$ into equations (19) and (25), the following equation is obtained:

$$V_{out} = \frac{1}{s_1}(a'V_8 - b'V_{out}). \quad (36)$$

In like manner, by substituting voltages $V_1$-$V_7$ into equations (26) and (29), the following equation is obtained:

$$V_8 = \frac{1}{s_2}(V_{in} - c'V_{out}). \quad (37)$$

By substituting equation (37) into equation (36), the low pass transfer function of the multi-purpose filter of FIG. 3 can be obtained as follows:

$$\frac{V_{out}}{V_{in}} = \frac{a'}{s_1 s_2 + b' s_2 + a' c'}. \quad (38)$$

As another example of the multi-purpose filter of FIG. 3 producing a band pass output, terminal 44 is selected as the input of the filter and terminal 45 is selected as the output thereof. Accordingly, $V_2 = V_{in}$, $V_7 = V_{out}$, and $V_1 = V_3 = V_4 = V_5 = V_6 = 0$. By substituting voltages $V_1$-$V_7$ into equations (19) and (25), the following equation is obtained:

$$V_{out} = \frac{1}{s_1}(a'V_8 - bV_{in} - b'V_{out}). \quad (39)$$

In like manner, if voltages $V_1$-$V_7$ are substituted into equations (26) and (29), the following equation is obtained:

$$V_8 = \frac{-c'}{s_2} V_{out}. \quad (40)$$

In this manner, by substituting equation (40) into equation (39) a band pass filter output can be obtained from output terminal 45 as follows:

$$\frac{V_{out}}{V_{in}} = \frac{-bs_2}{s_1 s_2 + b' s_2 + a' c'}. \quad (41)$$

It is to be appreciated that, with all of the above-described examples, terminal 45 was selected as the output of the multi-purpose filter according to the present invention. However, other terminals may be selected as the output of the multi-purpose filter. For example, if the base of transistor $Q_{24}$ is selected as the output of the multi-purpose filter, then the output voltage $V_{out}$ from the multi-purpose filter of FIG. 3 is expressed as the sum of the voltages supplied to the base of transistor $Q_{24}$ through the voltage divider circuit comprised of resistors 52 and 60, as follows:

$$V_{out} = b'V_7 + bV_2 \quad (42).$$

If the input of the multi-purpose filter of FIG. 3, in such case, is selected as terminal 44, then $V_2 = V_{in}$ and $V_1 = V_3 = V_4 = V_5 = V_6 = 0$. Substituting voltages $V_1$-$V_7$ into equations (19) and (25) results in the following equation:

$$V_7 = \frac{a'}{s_1 + b'} V_8 - \frac{b}{s_1 + b'} V_{in}. \quad (43)$$

In like manner, by substituting voltages $V_1$-$V_7$ into equations (26) and (30), the following equation is obtained:

$$V_8 = \frac{-c'}{s_2} V_7. \quad (44)$$

Substituting equation (44) into equation (43) and rearranging the terms to solve for the voltage $V_7$, the following equation is obtained:

$$V_7 = \frac{-bs_2}{s_1 s_2 + b's_2 + a'c'} V_{in}. \quad (45)$$

By rearranging the terms of equation (42) to solve for the voltage $V_7$ and equating the resultant equation with equation (45), the transfer characteristic of the multi-purpose filter of FIG. 3 is determined as follows:

$$\frac{V_{out}}{V_{in}} = \frac{bs_1 s_2 + a'bc'}{s_1 s_2 + b's_2 + a'c'}. \quad (46)$$

It is to be appreciated from equation (46) that, when the base of transistor $Q_{2A}$ is selected as the output of the multi-purpose filter of FIG. 3 and terminal 44 is selected as the input thereof, a trap filter output is obtained.

Thus, in accordance with the present invention as described above, different filter characteristics can be obtained merely by selecting different ones of the terminals as the input and output of the multi-purpose filter of FIG. 3. It is to be appreciated that, the multi-purpose filter of FIG. 3 does not require the use of discrete circuit elements, such as operational amplifiers and other RC circuits so that the construction thereof is relatively simplified. In this manner, the integration circuits and resistors used therein can be fabricated on the tip of an IC. Since the transfer characteristic of the multi-purpose filter of FIG. 3 is determined by the characteristics $s_1$ and $s_2$ of integration circuits 21A and 21B, and by resistors $r_a$, $r_a'$, $r_b$, $r_b'$, $r_c$ and $r_c'$, which are constructed in the integrated circuit, the transfer characteristic of the filter does not vary greatly with temperature changes. As a result, it is only necessary to select capacitors 36A and 36B to have small variations with respect to temperature.

Having described a specific preferred embodiment of the invention with reference to the accompanying drawings, it is to be understood that the present invention is not limited to that precise embodiment, and that various changes and modifications may be effected therein by one skilled in the art without departing from the scope or spirit of the invention as defined in the appended claims.

What is claimed is:

1. A filter comprising:
   first integration means including first differential amplifier means having first input terminal means and a first output, first capacitor means connected with said first output, and first output means;
   second integration means connected in series with said first integration means and including second differential amplifier means having second input terminal means and a second output, second capacitor means connected with said second output, and second output means;
   feedback means connected between said first and second output means and said first input terminal means; and
   at least one capacitor terminal means connected with said first and second capacitor means such that different filter characteristics are obtained by selecting different ones of said first input terminal means, said second input terminal means and said at least one capacitor terminal means as an input and an output of said filter.

2. A filter according to claim 1; in which said first differential amplifier means includes a first transistor having a first input connected with said second output means and a second transistor having a second input connected with said first output means, and said first input terminal means includes a first terminal also connected with said first input and a second terminal also connected with said second input.

3. A filter according to claim 2; in which said first input terminal means further includes a first resistive element connecting said second output means with said first input, a second resistive element connecting said first terminal with said first input, a third resistive element connecting said first output means with said second input, and a fourth resistive element connecting said second terminal with said second input.

4. A filter according to claim 3; in which said second differential amplifier means includes a third transistor having a third input connected with said first output means and a fourth transistor having a fourth input, and said second input terminal means includes a third terminal also connected with said third input and a fourth terminal connected with said fourth input.

5. A filter according to claim 4; in which said second input terminal means further includes a fifth resistive element connecting said first output means with said third input and a sixth resistive element connecting said third terminal with said third input.

6. A filter according to claim 1; in which said first output includes third differential amplifier means connected between said first differential amplifier means and said first capacitor means; and further including first constant current source means for supplying a first constant current to said first differential amplifier means and second constant current source means for supplying a second constant current to said third differential amplifier means, and the gain of said first integration means is determined by the ratio of said second constant current to said first constant current.

7. A filter according to claim 6; in which said second output includes fourth differential amplifier means connected between said second differential amplifier means and said second capacitor means; and further including third constant current source means for supplying a third constant current to said second differential amplifier means and fourth constant current source means for supplying a fourth constant current to said fourth differential amplifier means, and the gain of said second integration means is determined by the ratio of said fourth constant current to said third constant current.

8. A filter according to claim 1; in which said first capacitor means includes a first end and an opposite second end, and said at least one capacitor terminal means includes a first capacitor terminal and a second capacitor terminal connected with said first end and said second end; and said second capacitor means includes a third end and an opposite fourth end, and said at least one capacitor terminal means includes a third capacitor terminal and a fourth capacitor terminal connected with said third and fourth ends, respectively.

9. A filter according to claim 8; in which said first differential amplifier means includes a first input and a second input and said second differential amplifier means includes a third input and a fourth input; and said first input terminal means includes a plurality of first terminals connected with said first and second inputs and a plurality of second terminals connected with said third and fourth inputs, such that said different filter characteristics are obtained by selecting different ones of said first terminals, said second terminals and said capacitor terminals as said input and said output of said filter.

* * * * *